(12) United States Patent
Jiang

(10) Patent No.: US 10,553,447 B2
(45) Date of Patent: Feb. 4, 2020

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Li Jiang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/977,484

(22) Filed: May 11, 2018

(65) Prior Publication Data

US 2018/0330965 A1 Nov. 15, 2018

(30) Foreign Application Priority Data

May 12, 2017 (CN) .......................... 2017 1 0333287

(51) Int. Cl.
H01L 21/321 (2006.01)
H01L 21/762 (2006.01)
H01L 21/768 (2006.01)
H01L 21/3105 (2006.01)
H01L 21/306 (2006.01)

(52) U.S. Cl.
CPC .... H01L 21/3212 (2013.01); H01L 21/31053 (2013.01); H01L 21/7624 (2013.01); H01L 21/76819 (2013.01); H01L 21/30625 (2013.01)

(58) Field of Classification Search
CPC . B23B 31/20; H01L 21/3212; H01L 21/7624; H01L 21/76819; H01L 21/32115; H01L 21/30625
USPC .......... 438/692, 693, 694, 750; 134/1.1, 1.2, 134/1.3; 216/89, 90
See application file for complete search history.

(56) References Cited

U.S. PATENT DOCUMENTS

| | | | |
|---|---|---|---|
| 7,699,897 B2* | 4/2010 | Nguyen | A61K 8/31 132/202 |
| 2005/0124149 A1* | 6/2005 | Kim | H01L 21/31144 438/618 |
| 2005/0133931 A1 | 6/2005 | Jang et al. | |
| 2007/0155178 A1* | 7/2007 | Park | B24B 37/044 438/692 |
| 2010/0048007 A1* | 2/2010 | Lee | B24B 37/042 438/585 |

(Continued)

FOREIGN PATENT DOCUMENTS

WO 2006023437 A2 3/2006

Primary Examiner — Lan Vinh
(74) Attorney, Agent, or Firm — Anova Law Group, PLLC

(57) ABSTRACT

Semiconductor structures and fabrication methods thereof are provided. An exemplary fabrication process includes providing a base substrate; forming a carbon-containing dielectric layer over the base substrate; and performing a chemical mechanical polishing (CMP) process on the carbon-containing dielectric layer. The chemical mechanical polishing process includes performing a plurality of polishing processes on the carbon-containing dielectric layer and a weak acid solution is used to clean a polishing pad before and after each of the polishing processes.

19 Claims, 2 Drawing Sheets

(56) References Cited

U.S. PATENT DOCUMENTS

| | | | |
|---|---|---|---|
| 2011/0034329 A1* | 2/2011 | Coiffic | H01L 21/02126 |
| | | | 502/200 |
| 2013/0334590 A1* | 12/2013 | Watanabe | H01L 29/792 |
| | | | 257/324 |
| 2015/0024661 A1* | 1/2015 | Peng | B24B 53/017 |
| | | | 451/41 |
| 2016/0365426 A1* | 12/2016 | Ching | H01L 29/6656 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710333287.3, filed on May 12, 2017, the entirety of which is incorporated herein by reference.

FIELD OF THE DISCLOSURE

The present disclosure generally relates to the field of semiconductor manufacturing technologies and, more particularly, relates to semiconductor structures and fabrication methods thereof.

BACKGROUND

For semiconductor devices, reducing the resistance-capacitance (RC) delay can improve their performance. With the continuous development of semiconductor technologies and the advancement of the technical node, the performance of the semiconductor devices has become more and more powerful; the integration level of the semiconductor devices has become higher and higher; and the critical dimension (CD) of the semiconductor devices has become smaller and smaller. Correspondingly, further reducing the RC delay has become one of the important approaches to improve the performance of the semiconductor devices.

To reduce the RC delay, the interlayer dielectric layer of the semiconductor device is often made of a low dielectric constant (low-K) dielectric material, or ultra-low dielectric constant (ultra-low-K) dielectric material so as to improve the performance of the semiconductor devices. However, there is a need to further improve the performance of the semiconductor devices. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a base substrate; forming a carbon-containing dielectric layer over the base substrate; performing a chemical mechanical polishing (CMP) process on the carbon-containing dielectric layer, using a polishing pad for a plurality of polishing processes on the carbon-containing dielectric layer; and using a weak acid solution to treat the polishing pad before and after each of the plurality of polishing processes.

Another aspect of the present disclosure includes a semiconductor structure. The semiconductor structure is formed by providing a base substrate; forming a carbon-containing dielectric layer over the base substrate; performing a chemical mechanical polishing (CMP) process on the carbon-containing dielectric layer, using a polishing pad for a plurality of polishing processes on the carbon-containing dielectric layer; and using a weak acid solution to treat the polishing pad before and after each of the plurality of polishing processes.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A process for forming a semiconductor structure often includes providing a base substrate having a gate structure; forming an interlayer dielectric layer on the base substrate and covering the top surface of the gate structure; and removing the portion of the interlayer dielectric layer above the top surface of the gate structure using a polishing pad by a chemical mechanical polishing (CMP) process. To reduce the RC delay, the interlayer dielectric layer is often made of a low-K dielectric material, or an ultra-low-K dielectric material. For example, the interlayer dielectric layer is made of carbon-containing silicon oxide (SiOC).

However, SiOC is a carbon-containing material; and it is easy to form carbon chains; and it is tacky. Thus, during the CMP process, organic residues are easily formed on the surface of the polishing pad. Accordingly, the scratch defects may be formed on the surface of the interlayer dielectric layer.

The present disclosure provides a semiconductor structure and a fabrication thereof. In the disclosed fabrication method, during multiple times of polishing processes on the carbon-containing dielectric layer, a weak acid solution may be used to clean the polishing pad to remove the organic residues on the surface of the polishing pad before and after each of polishing processes. Thus, it may avoid the formation of the organic residues and prevent the scratch defects on the surface of the interlayer dielectric layer. Accordingly, the electrical properties of the semiconductor structure may be improved.

Figure 4:
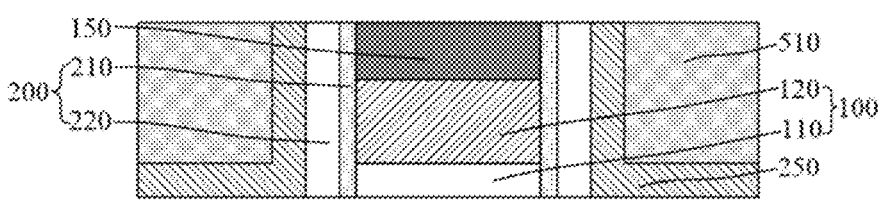
Figure 5:
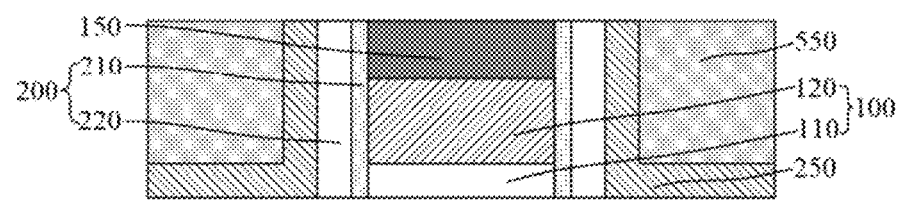
Figure 6:
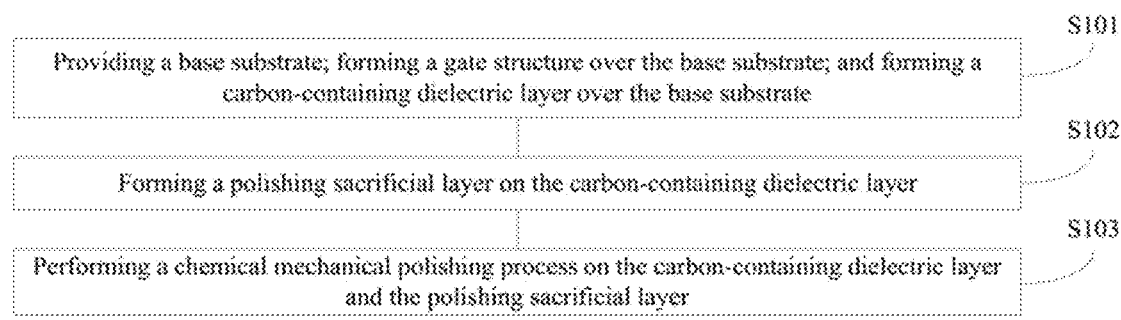
FIG. 6 illustrates an exemplary fabrication process of a semiconductor structure consistent with various disclosed embodiments

FIG. 6 illustrates an exemplary fabrication process of a semiconductor structure consistent with various disclosed embodiments. FIGS. 1-5 illustrate structures corresponding to certain stages during the exemplary fabrication process.

Figure 1:
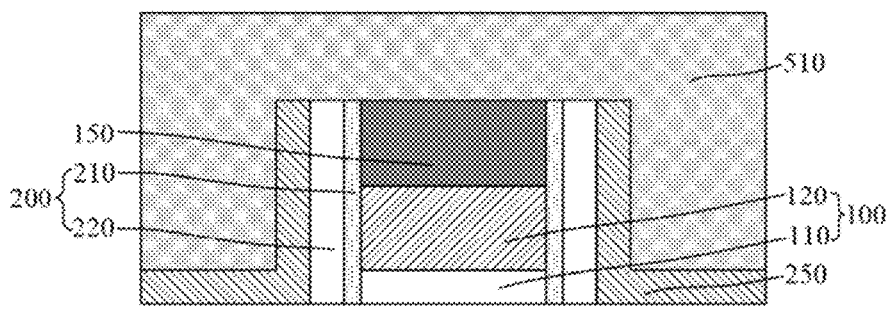
FIGS. 1-5 illustrate structures corresponding to certain stages during an exemplary fabrication process of a semiconductor structure consistent with various disclosed embodiments.

As shown in the FIG. 6, at the beginning of the fabrication process, a base substrate with certain structures is provide (S101). FIG. 1 illustrates a corresponding semiconductor structure.

As shown in FIG. 1, a base substrate is provided; and a gate structure 100 may be formed on a surface of the base substrate. Sidewall spacers 200 may be formed on the side surfaces of the gate structure 100. Further, an etching stop layer 250 may be formed on the side surfaces of the gate structure 100 and on the surface of the base substrate. Further, a carbon-containing dielectric layer 510 may be formed over the surface of the base substrate.

The base substrate provides a process platform for the subsequent processes.

In one embodiment, the semiconductor structure is a fin field-effect transistor (FinFET) structure. Thus, the base substrate may include a semiconductor substrate (not shown) and a plurality of discrete fins on the semiconductor substrate.

In some embodiments, the base substrate may be used to form a planar transistor. Thus, the base substrate be a planar semiconductor substrate.

In one embodiment, the semiconductor substrate is a silicon substrate. In some embodiments, the semiconductor substrate may be made of germanium, silicon germanium, gallium arsenide, or gallium indium, etc. The semiconductor substrate may also be a silicon on insulator (SOI) substrate, or a germanium on insulator (GOI) substrate, etc.

The fins may be made of a material same as the material of the semiconductor substrate. In one embodiment, the fins are made of silicon. In some embodiments, the fins may also be made of germanium, silicon germanium, silicon carbide, gallium arsenide, or gallium indium, etc.

The gate structure 100 may be formed on the base substrate. As shown in FIG. 1, a gate protection layer 150 may be formed on the top surface of the gate structure 100. For example, the gate structure 100 may be across the fins by covering portions of side and top surfaces of the fins.

The gate structure 100 may be used to control the "On/Off" of the channel region of the semiconductor structure.

In one embodiment, the gate structure 100 is a metal gate structure. For example, as shown in FIG. 1, the gate structure 100 may include a work function layer 110 and a metal layer 120 on the work function layer 110. A high dielectric constant (high-K) gate dielectric layer may be formed between the work function layer 110 and the base substrate.

Further, as shown in FIG. 1, after forming the gate structure 100, side wall spacers 200 may be formed on the side surfaces of the gate structure 100 and the gate protection layer 150. After forming the sidewall spacers 200, doped source/drain regions (not shown) may be formed in the base substrate at both sides of the gate structure 100.

The sidewall spacers 200 may be made of any appropriate material, such as silicon oxide, silicon nitride, silicon carbide, silicon carbonitride, silicon oxycarbonitride, silicon oxynitride, or boron carbonitride, etc. The sidewall spacers 200 may be single layer structures, or multiple-layer structures, etc. In one embodiment, as shown in FIG. 1, the sidewall spacers 200 are multiple-layer structures. The sidewall spacers may include silicon oxide layers 210 on the side surfaces of the gate structure 100 and the side surfaces of the protective layers 150; and silicon nitride layers 220 on the silicon oxide layers 210.

The doped source/drain regions (not shown) may be used as the source regions and/or the drain regions of the semiconductor structure. For example, the doped source/drain regions may be formed in the fins at both sides of the gate structure 100.

Further, as shown in FIG. 1, the contact etching stop layer (CESL) 250 may be formed on the surface of the base substrate (not shown) and the side surfaces of the sidewall spacers 200. In the field of semiconductor manufacturing, during the etching process for forming contact through (CT) plugs, the top surface of the CESL 250 may be used to define the stop position of the etching process so as to avoid under-etching and/or over-etching in different regions. In one embodiment, the CESL 250 is made of silicon nitride. In some embodiments, the CESL may be made of any other appropriate material.

The gate protection layer 150 may be used to protect the top surface of the gate structure 100 during the subsequent processes. In one embodiment, the gate protection layer 150 is made of silicon nitride. In some embodiments, the gate protection layer may be made of any other appropriate material.

A process for forming the gate protection layer 150 may include etching the gate structure 100 to remove a partial thickness of the gate structure 100 to form a trench (not shown) in the sidewall spacers 200; forming a gate protection material layer to fill the trench and cover the top surfaces of the sidewall spacers 200; and performing a planarization process to remove the portions of the gate protection material layer above the sidewall spacers 200. The remaining gate protection material layer in the trench may be configured as the gate protection layer 150.

In one embodiment, the top surface of the gate protection layer 150 levels with the top surfaces of the sidewall spacers 200. In some embodiments, the top surface of the gate protection layer may be below the top surfaces of the sidewall spacers.

To ensure the protection function of the gate protection layer 150 to the top surface of the gate structure 100 and avoid the thickness of the gate structure 100 to be so small to adversely affect the performance of the semiconductor structure, the thickness of the gate protection layer 150 may be kept in an appropriate range. In one embodiment, after forming the gate protection layer 150 on the gate electrode layer 120, the thickness of the gate protection layer 150 may be in a range of approximately 100 Å-300 Å.

The carbon-containing dielectric layer 510 may be made of a carbon-containing dielectric material, such as carbon-containing silicon oxide (SiOC), hydrogen carbon-containing silicon oxide (SiOCH), carbon-containing silicon oxynitride (SiOCN), or fluoride carbon compound, etc.

In one embodiment, after a subsequent chemical mechanical polishing (CMP) process, the top surface of the remaining carbon-containing dielectric layer 510 may be planarized. The top surface of the gate protection layer 150 may be exposed by the remaining carbon-containing dielectric layer 510; and the remaining carbon-containing dielectric layer 510 may be used as an interlayer dielectric layer.

To reduce the RC delay, the interlayer dielectric layer may be made of low-K dielectric material (the relative dielectric constant of the low-K dielectric material is equal to, or greater than approximately 2.6 and smaller than approximately 3.9), or ultra-low-K dielectric material (the relative dielectric constant of the ultra-low-K material is smaller than approximately 2.6). In one embodiment, the carbon-containing dielectric layer 510 is made of SiOC. In another embodiment, the carbon-containing dielectric layer 510 is made of SiOCH.

Various processes may be used to form the carbon-containing dielectric layer 510. In one embodiment, a chemical vapor deposition (CVD) process is used to form the carbon-containing dielectric layer 510.

The gate structure 100 may be formed on the base substrate; and the gate protection layer 150 may be formed on the top surface of the gate structure 100. Correspondingly, during the process for forming the carbon-containing dielectric layer 510, the carbon-containing dielectric layer 510 may also cover the top surface of the gate protection layer 150.

Figure 2:
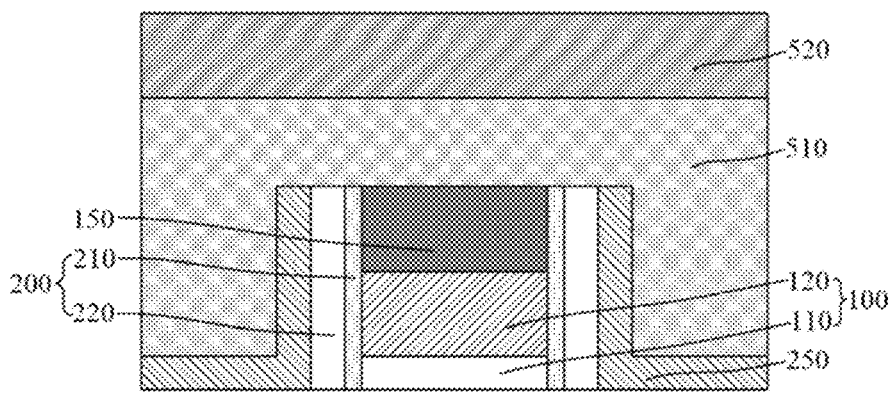

Returning to FIG. 6, after forming the carbon-containing dielectric layer, a polishing sacrificial layer may be formed (S102). FIG. 2 illustrates a corresponding semiconductor structure.

As shown in FIG. 2, a polishing sacrificial layer 520 is formed on the carbon-containing dielectric layer 510.

Carbon-containing material may easy form carbon chains; and may become tacky. Thus, during the subsequent CMP process, the carbon-containing dielectric layer 510 may be difficult to polish; and organic residues may be easily formed on the surface of the polishing pad. Thus, after forming the carbon-containing dielectric layer 510, the polishing sacrificial layer 510 may be formed on the carbon-containing dielectric layer 510 to prevent such issues.

By using the polishing sacrificial layer 520, when the top surface of the gate protection layer 150 exposed by the remaining carbon-containing dielectric layer 510 and the top surface of the carbon-containing dielectric layer 510 are planarized at the same time, the removed thickness of the carbon-containing layer 510 may not be too large. Thus, the organic residues may be reduced; and the process difficulty of the polishing process may be reduced.

In one embodiment, the polishing sacrificial layer 520 is made of tetraethyl orthosilicate (TEOS), or plasma-enhanced oxide (PEOX). In some embodiments, the polishing sacrificial layer may be made of other appropriate material.

The thickness of the carbon-containing dielectric layer 510 may be any appropriate value. If the thickness of the carbon-containing dielectric layer 510 is too small, the thickness of the subsequently formed interlayer dielectric layer may be too small. Thus, the carbon-containing dielectric layer 510 may at least cover the top surface of the gate protection layer 150. If the thickness of the carbon-containing dielectric layer 510 is too large, it may be easy to increase the process difficulty; and the organic residues may be increased. Thus, in one embodiment, after forming the carbon-containing layer 510, the thickness of the carbon-containing layer 510 may be in a range of approximately 1000 Å-2000 Å.

The thickness of the polishing sacrificial layer 520 may be any appropriate value. If the thickness of the polishing sacrificial layer 520 is too small, the flatness of the subsequently formed interlayer dielectric layer may be reduced. If the thickness of the polishing sacrificial layer 520 is too large, the process time may be increased; and the polishing efficiency may be reduced. Thus, in one embodiment, the thickness of the polishing sacrificial layer 520 is in a range of approximately 500 Å-3000 Å.

Figure 3:
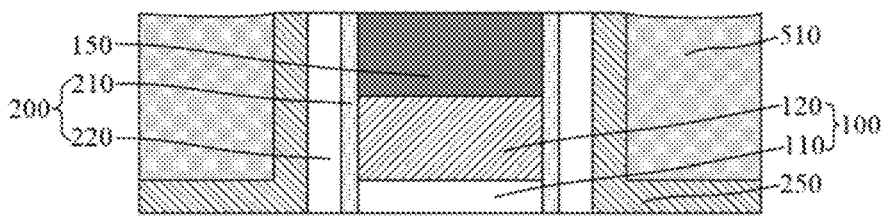

Returning to FIG. 6, after forming the polishing sacrificial layer, a chemical mechanical polishing (CMP) process may be performed (S103). FIGS. 3-4 illustrate corresponding semiconductor structures.

As shown in FIGS. 3-4, a chemical mechanical polishing (CMP) process is performed on the polishing sacrificial layer 520 and the carbon-containing dielectric layer 510. The CMP process may include polishing the polishing sacrificial layer 510 and the carbon-containing dielectric layer 510 for multiple times to remove the polishing sacrificial layer 510 and a top portion of the carbon-containing dielectric layer 510. Before each time of the polishing processes, a weak acid solution may be used to clean the polishing pad.

The carbon-containing material may be easy to form carbon-chains; and may be tacky. Thus, during the CMP process, organic residues may be formed on the surface of the polishing pad. The weak acid solution may be able to dissolve the organic residues to remove the organic residues on the polishing pad. Thus, the scratch defects may be prevented from forming on the surface of the remaining dielectric layer 510 (i.e., the interlayer dielectric layer).

The weak acid solution may be an organic weak acid solution, such as a citric acid solution, an acetic acid solution, a formic acid solution, or a caprylic acid solution, etc., or an inorganic weak acid solution, such as a carbonic acid solution, etc. In one embodiment, the weak acid solution is a citric acid solution.

The CMP process may include a first polishing process using a first polishing pad, a second polishing process using a second polishing pad, and a third polishing process using a third polishing pad. The first polishing process may remove the polishing sacrificial layer 520 and a partial thickness of the carbon-containing dielectric layer 510. The second polishing process may planarize the remaining carbon-containing dielectric layer 510. The third polishing step may be used to clean the planarized remaining carbon-containing dielectric layer 510. The compressibility of the second pad may be substantially same as the third polishing pad.

As shown in FIG. 3, the first polishing process may be used to remove the polishing sacrificial layer 520 and a major portion of the carbon-containing dielectric layer 510 above the gate protection layer 150.

The polishing slurry of the first polishing process may be a $CeO_2$ based polishing slurry. The compressibility of the first polishing pad may be relatively low. That is, the first polishing pad may be a hard pad.

The $CeO_2$ based polishing slurry may be able to remove a large quantity of SiOC material, but may have a relative low polishing rate to silicon nitride. Thus, the gate protection layer 150 may efficiently serve as a polishing stop layer. That is, the top surface of the polishing protection layer 150 may be used as the stop position of the first polishing process.

The hard pad may refer to as the polishing pad with high rigidity and less deformation horizontally.

In one embodiment, during the first polishing process, a friction force detection method or an optical endpoint method may be used to detect the top surface of the gate protection layer 150 to use the top surface of the gate protection layer 150 as the stop position. Thus, the top portion of the carbon-containing dielectric layer 510 above the top surface of the gate protection layer 150 may be removed. Accordingly, a process platform for subsequently planarizing the top surface of the remaining carbon-containing dielectric layer 510 may be provided. That is, after the first polishing process, the top surface of the gate protection layer 150 may be exposed by the remaining carbon-containing dielectric layer 510.

Referring to FIG. 2, the polishing sacrificial layer 520 may be formed on the carbon-containing dielectric layer 510. Thus, in one embodiment, the first polishing process may remove both the polishing sacrificial layer 520 and the portion of the carbon-containing layer dielectric layer 510 above the gate protection layer 150. In some embodiments, the polishing sacrificial layer may be removed before removing the portion of the carbon-containing layer dielectric layer above the gate protection layer.

To improve the polishing efficiency, and improve the surface quality of the remaining carbon-containing dielectric layer 510 after the first polishing process, the parameters of the first polishing process may be setup in an appropriate range, and may match to each other. In one embodiment, the down force of the first polishing process may be in a range of approximately 2 psi (i.e., pounds per square inch)-4 psi. The platen speed may be in a range of approximately 40 rpm (i.e., rounds per minute)-120 rpm. The flow rate of the polishing slurry may be in range of approximately 100 ml/min-400 ml/min.

To remove the organic residues on the surface of the first polishing pad and reduce the scratch defects on the surface of the remaining carbon-containing dielectric layer 510, before the first polishing process and after the first polishing process, a weak acid solution may be used to clean the first polishing pad. In one embodiment, the weak acid solution is a citric acid solution.

For example, before the top surface of the carbon-containing dielectric layer 510 contacts with the first polishing pad, and after finishing the first polishing process and the surface of the remaining carbon-containing dielectric layer 510 does not contact with the first polishing pad, the citric acid solution may be used to clean the first polishing pad.

When the weak acid solution is used to clean the polishing pad, the cleaning time may be any appropriate value. If the cleaning time is too short, the organic residues on the surface of the first polishing pad may be not be sufficiently removed; and it may be difficult to reduce scratch defects on the surface of the remaining carbon-containing dielectric layer 510. If the cleaning time is too long, it may cause a waste of time and resource; and increase the process risk. Thus, in one embodiment, the cleaning time may be in a range of approximately 10 s-60 s.

As shown in FIG. 4, the second polishing process may be used to planarize and repair the remaining carbon-containing dielectric layer 510. That is, by performing the second polishing process, the flatness of the subsequently formed interlayer dielectric layer may be improved.

Referring to FIG. 3, after the first polishing process, the top surface of the remaining carbon-containing layer 510 may be easy to have the dishing issue. Thus, to improve the flatness of the subsequently formed interlayer dielectric layer, a partial thickness of the gate protection layer 150 may be removed during the second polishing process.

The polishing slurry of the second polishing process may be a gel type $SiO_2$ based polishing slurry. The second polishing pad may have a relatively high compressibility. That is, the second polishing pad may be a soft pad.

The gel type $SiO_2$ polishing slurry may have a relatively low polishing rate; and it may consume silicon nitride. Thus, it may be able to planarize and repair the remaining carbon-containing dielectric layer 150.

Further, during the second polishing process, a partial thickness of the sidewall spacers 200 and the etching stop layer 250 may also be removed. That is, after the second polishing process, the top surface of the gate protection layer 150, the top surface of the etching stop layer 250 and the top surfaces of the sidewall spacers 200 may still level with each other.

The soft pad may refer to as the polishing pad with low rigidity and more deformation horizontally.

In one embodiment, during the second polishing process, the thickness of the remaining carbon-containing dielectric layer 510 may be controlled to be the targeted process value by controlling the polishing time or by detecting the thickness of the remaining carbon-containing dielectric layer 510. Further, after the second polishing process, the top surface of the remaining carbon-containing dielectric layer 510 may have a sufficiently high flatness.

To improve the polishing efficiency and improve the quality of the surface of the remaining carbon-containing dielectric layer 510 after the second polishing process, the parameters of the second polishing process may be set in appropriate ranges; and may match to each other. In one embodiment, the down force of the second polishing process may be in a range of approximately 1 psi-3 psi. The platen speed may be in a range of approximately 30 rpm-90 rpm. The flow rate of the polishing slurry may be in a range of approximately 100 ml/min-400 ml/min.

In one embodiment, to ensure the flatness of the top surface of the remaining carbon-containing layer 510 and reduce the dish defects on the top surface of the remaining carbon-containing dielectric layer 150 after the second polishing process, the thickness of the removed portion of the gate protection layer 150 may be in a range of approximately 50 Å-150 Å after the second polishing process. The thickness of the removed portion of the gate protection layer 150 may be determined according to the process requirements.

In one embodiment, to remove organic residues on the surface of the second polishing pad and reduce the scratch defects after the second polishing process, before the second polishing process and after the second polishing process, a weak acid solution may be used to clean the second polishing pad. In one embodiment, the weak acid solution is a citric acid solution.

For example, before the top surface of the remaining carbon-containing dielectric layer 510 contacts with the surface of the second polishing pad, the citric acid solution may be used to clean the second polishing pad.

In one embodiment, when the weak acid solution is used to clean the second polishing pad, the cleaning time may be in a range of approximately 10 s-60 s. If the cleaning time is too short, the organic residues on the surface of the second polishing pad may not be sufficiently removed; and it may be difficult to reduce scratch defects on the surface of the remaining carbon-containing dielectric layer 510. If the cleaning time is too short, it may cause a waste of time and resource; and increase the process risk.

As shown in FIG. 5, after the second polishing process, the third polishing process may be performed to make the remaining carbon-containing dielectric layer 510 as an interlayer dielectric layer 500.

The third polishing process may be used to clean the surface of the remaining carbon containing layer 510 for the first time; and to make the surface of the remaining carbon-containing layer 510 to be hydrophilic. Thus, a process base is provided for subsequently performing a second time cleaning.

In one embodiment, the polishing slurry of the third polishing process is an organic acid solution. The organic acid solution may contain hydrophilic function groups and hydrophobic function groups. The third polishing process may be performed using a third polishing pad. The third polishing pad may be a soft pad.

In one embodiment, the third polishing process may also be used to chemically polish the surface of the remaining carbon-containing dielectric layer 510 to remove the particles and organic residues on the surface of the remaining carbon-containing dielectric layer 510.

SiOC is a hydrophobic material. The organic acid may contain hydrophilic function groups and hydrophilic function groups. The hydrophobic function groups may be absorbed on the surface of the remaining carbon-containing dielectric layer 510. The hydrophilic function groups may attract hydrogen bonds. Thus, using the organic acid may turn the hydrophobic the surface of the remaining carbon-containing dielectric layer 510 into hydrophilic.

For example, the hydrophobic function groups may include alkyl groups, or benzene rings, etc. The hydrophilic function groups may include hydroxyl groups, or carboxyl groups, etc.

In one embodiment, the third polishing process may be performed by control the polishing time (i.e. By-Time). As shown in FIG. 5, after the third polishing process, the remaining carbon-containing dielectric layer 510 may be configured as the interlayer dielectric layer 550.

To improve the polishing efficiency; ensure the surface of the interlayer dielectric layer 550 to have a hydrophilic property; and reduce the particles and the organic residues on the surface of the interlayer dielectric layer 550, the parameters of the third polishing process may be set in appropriate ranges. In one embodiment, the down force of the third polishing process may be in a range of approximately 1 psi-3 psi. The platen speed may be in a range of approximately 30 rpm-90 rpm. The flow rate of the polishing slurry may be in a range of approximately 200 ml/min-400 ml/min. The polishing time may be in a range of approximately 20 s-60 s.

In one embodiment, to remove organic residues on the surface of the third polishing pad and reduce the scratch defects on the surface of the interlayer dielectric layer 550 after the third polishing process, before the third polishing process and after the third polishing process, a weak acid solution may be used to clean the third polishing pad. In one embodiment, the weak acid solution is a citric acid solution.

For example, before the top surface of the remaining carbon-containing dielectric layer 510 contacts with the surface of the third polishing pad and after the top surface of the interlayer dielectric layer 550 contacts with the surface of the third polishing pad, the citric acid solution may be used to clean the third polishing pad.

In one embodiment, the cleaning time for the third polishing pad may be in a range of approximately 10 s-60 s. If the cleaning time is too short, the organic residues on the surface of the third polishing pad may not be sufficiently removed; and it may be difficult to reduce scratch defects on the surface of the interlayer dielectric layer 550. If the cleaning time is too long, it may cause a waste of time and resource; and increase the process risk.

In one embodiment, the carbon-containing dielectric layer 510 is made of SiOC. Thus, the interlayer dielectric layer 550 may also be made of SiOC. In some embodiments, the interlayer dielectric layer may also be made of SiOCH.

In one embodiment, after the CM' process, a second cleaning process may be performed on the base substrate.

The second cleaning process may be used to remove the particles, etc., on the surfaces of the interlayer dielectric layer 550, the gate protection layer 150, the surfaces of the sidewall spacers 200 and the surface of the etching stop layer 250.

In one embodiment, the second cleaning process may include sequentially cleaning the base substrate using an organic acid solution and deionized water (DIW). During the step using DIW, the cleaning time may be smaller than approximately 30 s; and the flow rate of the DIW may be greater than approximately 1000 ml.

Using the organic acid solution first and followed by DIW may avoid the surface of the interlayer dielectric layer 550 from turning back to be hydrophobic. Thus, it may aid the cleaning of DIW to the base substrate.

In some embodiments, DIW may be used to perform the second cleaning directly.

In the disclosed embodiments, during performing the multiple polishing processes to the carbon-containing dielectric layer 510, before and after each polishing process, a weak acid solution may be used to clean the polishing pad, the organic residues on the surface of the polishing pad may be removed. Thus, it may prevent forming organic residues and scratch defects on the surface of the interlayer dielectric layer; and the electrical properties of the semiconductor structure may be improved.

Further, the present disclosure also provides a semiconductor structure. The corresponding semiconductor structure is illustrated in FIG. 5.

As shown in FIG. 5, the semiconductor structure may include a base substrate (not shown) and a gate structure 100 formed on the base substrate. The semiconductor structure may also include a gate protection layer 150 on the top surface of the gate structure 100 and sidewall spacers 200 on the side surfaces of the gate structure 100. The gate structure may include a work function layer 110 and a metal layer 120 on the work function layer 110. The sidewall spacers 200 may include silicon oxide layers 210 on the side surfaces of the gate structure 100 and silicon nitride layers 220 on the side surfaces of the silicon oxide layers 210. Further, the semiconductor structure may also include an etching stop layer 250 on the side surfaces of the sidewall spacers 200 and the top surface of the base substrate; and an interlayer dielectric layer with a substantially small amount of scratch defects or being free of scratch defects and organic residues. The detailed structures and intermediate structures are described above with respect to the fabrication processes.

The surface of the semiconductor substrate may have substantially small amount of scratch defects or be free of scratch defects and organic residues. Thus, the electrical properties of the semiconductor structure may be improved.

In the disclosed embodiments, during the multiple times of polishing processes performed to the carbon-containing dielectric layer, before each time of the polishing process (i.e., Pre-CMP) and after each time of the polishing process (i.e., after-CMP), a weak acid solution may be used to clean the polishing pad. Because the weak acid solution may be able to dissolve organic residues, the organic residues on the surface of the polishing pads may be removed. Thus, it may avoid forming the scratch defects on the surface of the interlayer dielectric layer; and the electrical properties of the semiconductor structure may be improved.

Further, a gate structure may be formed on the surface of the base substrate. After performing the chemical mechanical polishing (CMP) process on the carbon-containing dielectric layer, the remaining carbon-containing dielectric layer may be used as the interlayer dielectric layer. The interlayer dielectric layer may be made of SiOC, or SiOCH, etc. Thus, not only the scratch defects and/or the organic residues may be prevented from forming on the surface of the interlayer dielectric layer, but also the RC delay may be reduced. Accordingly, the electrical properties of the semiconductor structure may be improved.

Further, the interlayer dielectric layer may be made of SiOC or SiOCH. SiOC and SiOCH are hydrophobic materials. The polishing slurry of the third polishing process may be an organic acid solution. The organic acid solution may contain hydrophilic function groups and hydrophobic function groups. The hydrophobic function groups may be absorbed on the remaining carbon-containing dielectric layer; and the hydrophilic function groups may attract hydrogen bonds. Thus, using the organic acid solution may turn the hydrophobic surface of the remaining carbon-containing dielectric layer to a hydrophilic surface. Accordingly, it may aid to perform the subsequent second cleaning process on the base substrate.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
   providing a base substrate;
   forming a carbon-containing dielectric layer over the base substrate;
   forming a polishing sacrificial layer on the carbon-containing dielectric layer;
   performing chemical mechanical polishing (CMP) processes on the polishing sacrificial layer and the carbon-containing dielectric layer, using a polishing pad for each of the chemical mechanical polishing processes on the carbon-containing dielectric layer, wherein a compressibility of a polishing pad for a first of the chemical mechanical polishing processes is greater than a compressibility of polishing pads for remaining chemical mechanical polishing processes; and
   using a weak acid solution to treat the polishing pad before and after each of the chemical mechanical polishing processes.

2. The method according to claim 1, wherein:
   the weak acid solution includes one of a citric acid solution, an acetic acid solution, a formic acid solution, a caprylic acid solution, and a carbonic acid solution.

3. The method according to claim 1, wherein:
   the weak acid solution is used to treat the polishing pad for approximately 10 seconds to 60 seconds.

4. The method according to claim 1, wherein:
   the carbon-containing dielectric layer is made of one of carbon-containing silicon oxide (SiOC), hydrocarbon containing silicon oxide (SiOCH), carbon-containing silicon oxynitride (SiOCN) and a carbon fluoride compound.

5. The method according to claim 1, wherein performing the chemical mechanical polishing (CMP) process comprises:
   performing a first polishing process on the carbon-containing dielectric layer to remove a partial thickness of the carbon-containing layer using a first polishing pad;
   after performing the first polishing process, performing a second polishing process on a remaining carbon-containing dielectric layer to planarize the remaining carbon-containing layer using a second polishing pad with a compressibility greater than a compressibility of the first polishing pad; and
   after performing the second polishing process, performing a third polishing process on a planarized remaining carbon-containing dielectric layer to perform a first cleaning process on the planarized remaining carbon-containing dielectric layer using a third polishing pad with a compressibility substantially same as the compressibility of the second polishing pad, wherein a gate structure is formed over the base substrate, a gate protection layer on the gate structure, and a partial thickness of the gate protection layer is removed in the second polishing process before performing the third polishing process.

6. The method according to claim 5, wherein:
   a down force of the first polishing process is in a range of approximately 2 psi-4 psi;
   a platen speed of the first polishing process is in range of approximately 40 rpm-120 rpm;
   a polishing slurry of the first polishing process is a $CeO_2$ based polishing slurry; and
   a flow rate of the $CeO_2$ based polishing slurry is in a range of approximately 100 ml/min-400 ml/min.

7. The method according to claim 5, wherein:
   a down force of the second polishing process is in a range of approximately 1 psi-3 psi;
   a platen speed of the second polishing process is in range of approximately 30 rpm-90 rpm;
   a polishing slurry of the second polishing process is a $SiO_2$ gel based polishing slurry; and
   a flow rate of the $SiO_2$ gel based polishing slurry is in a range of approximately 100 ml/min-400 ml/min.

8. The method according to claim 5, wherein:
   a polishing slurry of the third polishing process is an organic acid solution containing hydrophobic function groups and hydrophilic function groups.

9. The method according to claim 8, wherein:
   a down force of the third polishing process is in a range of approximately 1 psi-3 psi;
   a platen speed of the third polishing process is in range of approximately 30 rpm-90 rpm;
   a flow rate of the polishing slurry of the third polishing process is in a range of approximately 200 ml/min-400 ml/min; and
   a polishing time of the third polishing process is in a range of approximately 20 s-60 s.

10. The method according to claim 1, further comprising:
    forming a gate structure over the base substrate; and
    forming a gate protection layer on the gate structure,
    wherein the carbon-containing dielectric layer is formed to cover a top surface of the gate protection layer.

11. The method according to claim 10, wherein:
    a remaining carbon-containing dielectric layer exposes the top surface of the gate protection layer after the chemical mechanical polishing process; and
    the remaining carbon-containing dielectric layer is configured as an interlay dielectric layer.

12. The method according to claim 11, wherein:
    the interlay dielectric layer is made of one of carbon-containing silicon oxide (SiOC) and carbon-hydrogen-containing silicon oxide (SiOCH).

13. The method according to claim 10, wherein:
    the gate protection layer is made of silicon nitride.

14. The method according to claim 1, after forming the carbon-containing dielectric layer, further comprising:
    forming a polishing sacrificial layer on the carbon-containing dielectric layer.

15. The method according to claim 14, before performing the chemical mechanical polishing process, further comprising:
    removing the polishing sacrificial layer.

16. The method according to claim 14, wherein:
    the polishing sacrificial layer is made of one of tetraethyl orthosilicate (TEOS) and plasma-enhanced oxide (PEOX).

17. The method according to claim 14, wherein:
    a thickness of the polishing sacrificial layer is in a range of approximately 500 Å-3000 Å.

18. The method according to claim 1, wherein:
    a thickness of the carbon-containing layer is in a range of approximately 1000 Å-2000 Å.

19. The method according to claim 1, after performing the chemical mechanical polishing process, further comprising:
    performing a second cleaning process on the base substrate.

* * * * *